(12) United States Patent
Feng et al.

(10) Patent No.: US 10,788,380 B2
(45) Date of Patent: Sep. 29, 2020

(54) APPARATUS FOR DETECTING CAPACITANCE, ELECTRONIC DEVICE AND APPARATUS FOR DETECTING FORCE (71) Applicant: SHENZHEN GOODIX TECHNOLOGY CO., LTD., Shenzhen (CN)

(72) Inventors: Lin Feng, Shenzhen (CN); Hong Jiang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 302 days.

(21) Appl. No.: 15/925,768

(22) Filed: Mar. 20, 2018

(65) Prior Publication Data
US 2018/0209858 A1 Jul. 26, 2018

Related U.S. Application Data (63) Continuation of application No. PCT/CN2017/071490, filed on Jan. 18, 2017.

(51) Int. Cl.
G01R 27/26 (2006.01)
G01L 1/14 (2006.01)
(Continued)

(52) U.S. Cl.
CPC .............. G01L 1/144 (2013.01); G06F 3/044 (2013.01); G06F 3/0416 (2013.01);
(Continued)

(58) Field of Classification Search
USPC ................................................. 324/658–686
See application file for complete search history.

(56) References Cited

U.S. PATENT DOCUMENTS 6,278,283 B1 * 8/2001 Tsugai ............... G01R 27/2605
324/678
7,616,011 B2 11/2009 Zarabadi et al.
(Continued)

FOREIGN PATENT DOCUMENTS

CN 101387669 A 3/2009
CN 101551420 A 10/2009
(Continued)

OTHER PUBLICATIONS

International Search Report for International Application No. PCT/CN2017/071490, Applicant: Shenzhen Goodix Technology Co., Ltd., dated Sep. 30, 2017, 6 pages.

Primary Examiner — Vincent Q Nguyen (57) ABSTRACT

An apparatus for detecting capacitance, an electronic device and an apparatus for detecting a force are disclosed. The apparatus for detecting capacitance includes: a signal driving circuit (110), configured to periodically charge and discharge at least one capacitor to be detected; a conversion circuit (120), configured to convert a capacitance signal of the at least one capacitor to be detected into a voltage signal; and a cancellation circuit (130), configured to cancel initial capacitance of the at least one capacitor to be detected, so that the voltage signal is associated with a capacitance change of the at least one capacitor to be detected. The apparatus for detecting capacitance could improve the anti-interference performance and improve the accuracy of capacitance detection.

14 Claims, 4 Drawing Sheets (51) Int. Cl.
*G06F 3/044* (2006.01)
*G06F 3/041* (2006.01)
*H03F 3/45* (2006.01)

(52) U.S. Cl.
CPC ... *H03F 3/45475* (2013.01); *H03F 2200/261* (2013.01); *H03F 2203/45116* (2013.01); *H03F 2203/45138* (2013.01); *H03F 2203/45156* (2013.01); *H03F 2203/45514* (2013.01)

(56) References Cited

U.S. PATENT DOCUMENTS

| | | |
|---|---|---|
| 8,106,893 B2 | 1/2012 | Fujita et al. |
| 8,614,587 B1 | 12/2013 | Ogirko et al. |
| 9,182,432 B2 | 11/2015 | Shahrokhi et al. |
| 9,310,924 B2 | 4/2016 | Hanssen et al. |
| 9,529,030 B2 | 12/2016 | Ogirko et al. |
| 9,612,684 B2 | 4/2017 | Chen et al. |
| 9,671,916 B2 | 6/2017 | Hanssen et al. |
| 2008/0246495 A1 | 10/2008 | Zarabadi et al. |
| 2009/0073140 A1 | 3/2009 | Fujita et al. |
| 2012/0200306 A1 | 8/2012 | Iwamoto et al. |
| 2013/0342496 A1* | 12/2013 | Tsai ............ G06F 3/0418 345/174 |
| 2014/0021966 A1 | 1/2014 | Shahrokhi et al. |
| 2014/0085252 A1 | 3/2014 | Hanssen et al. |
| 2014/0104226 A1 | 4/2014 | Lee et al. |
| 2015/0317033 A1 | 11/2015 | Chen et al. |
| 2015/0323578 A1 | 11/2015 | Shahrokhi et al. |
| 2016/0003881 A1 | 1/2016 | Ogirko et al. |
| 2016/0124552 A1 | 5/2016 | Iwamoto et al. |
| 2016/0224160 A1 | 8/2016 | Hanssen et al. |
| 2016/0370948 A1 | 12/2016 | Lee et al. |
| 2017/0160323 A1 | 6/2017 | Chen et al. |

FOREIGN PATENT DOCUMENTS

| | | |
|---|---|---|
| CN | 102221646 A | 10/2011 |
| CN | 103684408 A | 3/2014 |
| CN | 104603728 A | 5/2015 |
| CN | 105556321 A | 5/2016 |
| CN | 106055183 A | 10/2016 |
| CN | 106257387 A | 12/2016 |
| CN | 106537106 A | 3/2017 |
| CN | 206440771 U | 8/2017 |

* cited by examiner

APPARATUS FOR DETECTING CAPACITANCE, ELECTRONIC DEVICE AND APPARATUS FOR DETECTING FORCE

CROSS-REFERENCE TO RELATED APPLICATIONS

This application is a continuation of International Patent Application No. PCT/CN2017/071490, with an international filing date of Jan. 18, 2017, which is hereby incorporated by reference in its entireties.

TECHNICAL FIELD

The present disclosure relates to the field of information technologies, and more specifically, to an apparatus for detecting capacitance, an electronic device and an apparatus for detecting a force.

BACKGROUND

With the development of information technologies, more and more electronic devices adopt a capacitive sensor, such as a capacitive touch screen, a capacitive force sensor and a capacitive displacement sensor, to detect an external physical signal. A capacitance detection technology is a key technology of realizing the capacitive sensor, and a capacitance change of a capacitor is detected through the capacitance detection technology so as to detect a signal to be detected.

An accuracy of detecting capacitance decides an accuracy of signal detection. Therefore, how to improve the accuracy of detecting the capacitance is a technical problem to be solved urgently.

SUMMARY

Embodiments of the present disclosure provide an apparatus for detecting capacitance, an electronic device and an apparatus for detecting a force, which could improve an accuracy of capacitance detection.

According to a first aspect, an apparatus for detecting capacitance is provided, including:

a signal driving circuit 110, configured to periodically charge and discharge at least one capacitor to be detected;

a conversion circuit 120, configured to convert a capacitance signal of the at least one capacitor to be detected into a voltage signal; and a cancellation circuit 130, configured to cancel initial capacitance of the at least one capacitor to be detected, so that the voltage signal is associated with a capacitance change of the at least one capacitor to be detected.

The apparatus for detecting capacitance of the embodiments of the present disclosure may detect a slight capacitance change, and may improve the accuracy of capacitance detection.

In some possible implementation manners, the at least one capacitor to be detected includes a first capacitor 101 to be detected; and a differential mode signal of voltage signals at different times which are output by the conversion circuit 120 represents a capacitance change of the first capacitor 101 to be detected.

In some possible implementation manners, the signal driving circuit 110 includes a first switch 111, a second switch 112, a third switch 113 and a first direct current voltage source 115; and one end of the first capacitor 101 to be detected is connected to the first direct current voltage source 115 via the third switch 113 and the first switch 111, the one end of the first capacitor 101 to be detected is grounded via the third switch 113 and the second switch 112, and the other end of the first capacitor 101 to be detected is grounded.

In some possible implementation manners, the conversion circuit 120 includes a fourth switch 121, a fifth switch 122, a first feedback capacitor 123 and a first operational amplifier 124;

the fourth switch 121 is connected between one end of the first capacitor 101 to be detected and an inverting input of the first operational amplifier 124;

the first feedback capacitor 123 is connected between the inverting input and an output of the first operational amplifier 124;

the fifth switch 122 is connected between the inverting input and the output of the first operational amplifier 124; and a common mode voltage Vcm is input to a non-inverting input of the first operational amplifier 124.

In some possible implementation manners, the cancellation circuit 130 includes a first adjustable capacitor 131, a sixth switch 132, a seventh switch 133, an eighth switch 134, a ninth switch 135 and a second direct current voltage source 139;

one end of the first adjustable capacitor 131 is connected to the second direct current voltage source 139 via the sixth switch 132, the one end of the first adjustable capacitor 131 is grounded via the seventh switch 133, and the other end of the first adjustable capacitor 131 is connected to the inverting input of the first operational amplifier 124; and the eighth switch 134 and the ninth switch 135 are configured to change switch control signals controlling the sixth switch 132 and the seventh switch 133.

By adopting an operation time sequence of driving a signal positively and negatively, the apparatus for detecting capacitance of the embodiments of the present disclosure has an excellent ability of suppressing low-band common-mode noise and 1/f noise.

In some possible implementation manners, the at least one capacitor to be detected includes a first capacitor 101 to be detected and a second capacitor 102 to be detected; and a differential signal of voltage signals which are output by the conversion circuit 120 and are corresponding to the first capacitor 101 to be detected and the second capacitor 102 to be detected represents a capacitance change of the first capacitor 101 to be detected and the second capacitor 102 to be detected.

In some possible implementation manners, the signal driving circuit 110 includes a first switch 111, a second switch 112, a third switch 113, a tenth switch 114 and a first direct current voltage source 115;

one end of the first capacitor 101 to be detected is connected to the first direct current voltage source 115 via the third switch 113 and the first switch 111, the one end of the first capacitor 101 to be detected is grounded via the third switch 113 and the second switch 112, and the other end of the first capacitor 101 to be detected is grounded; and one end of the second capacitor 102 to be detected is connected to the first direct current voltage source 115 via the tenth switch 114 and the first switch 111, the one end of the second capacitor 102 to be detected is grounded via the tenth switch 114 and the second switch 112, and the other end of the second capacitor 102 to be detected is grounded.

In some possible implementation manners, the conversion circuit 120 includes a fourth switch 121, a fifth switch 122, a first feedback capacitor 123, a first operational amplifier 124, an eleventh switch 125, a twelfth switch 126, a second feedback capacitor 127 and a second operational amplifier 128;

the fourth switch 121 is connected between one end of the first capacitor 101 to be detected and an inverting input of the first operational amplifier 124;

the first feedback capacitor 123 is connected between the inverting input and an output of the first operational amplifier 124;

the fifth switch 122 is connected between the inverting input and the output of the first operational amplifier 124;

the eleventh switch 125 is connected between one end of the second capacitor 102 to be detected and an inverting input of the second operational amplifier 128;

the second feedback capacitor 127 is connected between the inverting input and an output of the second operational amplifier 128;

the twelfth switch 126 is connected between the inverting input and the output of the second operational amplifier 128; and a common mode voltage Vcm is input to both non-inverting inputs of the first operational amplifier 124 and the second operational amplifier 128.

In some possible implementation manners, the cancellation circuit 130 includes a first adjustable capacitor 131, a sixth switch 132, a seventh switch 133, an eighth switch 134, a ninth switch 135, a second adjustable capacitor 136, a thirteenth switch 137, a fourteenth switch 138 and a second direct current voltage source 139;

one end of the first adjustable capacitor 131 is connected to the second direct current voltage source 139 via the sixth switch 132, the one end of the first adjustable capacitor 131 is grounded via the seventh switch 133, and the other end of the first adjustable capacitor 131 is connected to the inverting input of the first operational amplifier 124;

one end of the second adjustable capacitor 136 is connected to the second direct current voltage source 139 via the thirteenth switch 137, the one end of the second adjustable capacitor 136 is grounded via the fourteenth switch 138, and the other end of the second adjustable capacitor 136 is connected to the inverting input of the second operational amplifier 128; and the eighth switch 134 and the ninth switch 135 are configured to change switch control signals controlling the sixth switch 132, the seventh switch 133, the thirteenth switch 137 and the fourteenth switch 138.

In some possible implementation manners, the apparatus further includes:

a programmable gain amplifier 140, configured to output a differential signal according to voltage signals corresponding to the first capacitor 101 to be detected and the second capacitor 102 to be detected.

In some possible implementation manners, an output voltage of the first direct current voltage source 115 is equal to that of the second direct current voltage source 139.

In some possible implementation manners, the output voltage is twice the magnitude of the common mode voltage Vcm.

In some possible implementation manners, the first capacitor to be detected and the second capacitor to be detected are capacitors in a differential capacitive sensor.

By adopting a differential structure, the apparatus for detecting capacitance of the embodiments of the present disclosure has an excellent ability of suppressing a temperature drift.

According to a second aspect, an electronic device is provided, including the apparatus for detecting capacitance in the first aspect or any one of the possible implementation manners of the first aspect.

According to a third aspect, an apparatus for detecting a force is provided, including the apparatus for detecting capacitance in the first aspect or any one of the possible implementation manners of the first aspect, where a force which is to be detected by the apparatus for detecting a force is associated with a capacitance change of a capacitor to be detected which is to be detected by the apparatus for detecting capacitance.

DESCRIPTION OF EMBODIMENTS

Technical solutions of embodiments of the present disclosure may be applied to various devices adopting a touch technology, for example, an active pen, a capacitive pen, a mobile terminal, a computer, a home appliance, etc. An apparatus for detecting capacitance of the embodiments of the present disclosure may be disposed in various touch devices so as to be used to detect a touch capacitor, i.e., a capacitance change of a capacitor to be detected, and then detect a change of a force generated by a touch, etc.

It should be understood that the capacitance change of the capacitor to be detected may either be a relative value, or be an absolute value, for example, in the case where initial capacitance of the capacitor to be detected is zero, the capacitance change of the capacitor to be detected is an absolute value of capacitance of the capacitor.

It should also be understood that capacitance of the capacitor may also be called a capacitance value. In the following, for convenience of description, explanations are made by taking the capacitor and the capacitance of the capacitor as examples.

Figure 1:
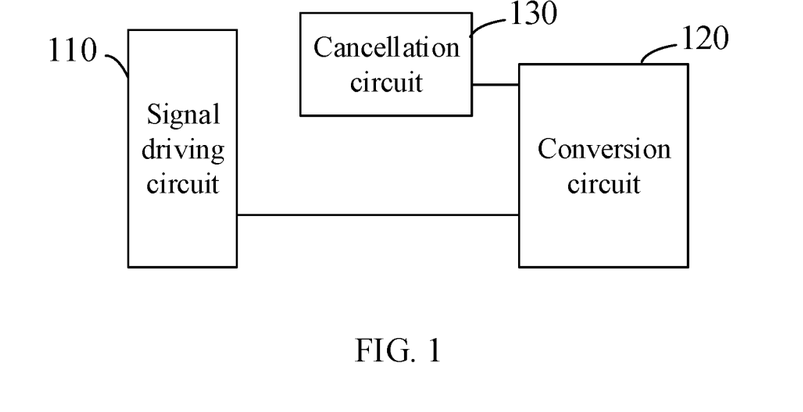
FIG. 1 is a schematic diagram of an apparatus for detecting capacitance of an embodiment of the present disclosure.

FIG. 1 shows a schematic diagram of an apparatus for detecting capacitance of an embodiment of the present disclosure.

As shown in FIG. 1, the apparatus may include a signal driving circuit 110, a conversion circuit 120 and a cancellation circuit 130.

The signal driving circuit 110 is configured to periodically charge and discharge at least one capacitor to be detected.

The signal driving circuit 110 may also be called a driving circuit, and for example, it could realize charging and discharging of a capacitor to be detected via switchover.

The conversion circuit 120 is configured to convert a capacitance signal of the at least one capacitor to be detected into a voltage signal.

The conversion circuit 120 is a capacitance/voltage (C/V) converting circuit, for example, it can convert a capacitance signal into a voltage signal via an operational amplifier and a feedback circuit.

The cancellation circuit 130 is configured to cancel initial capacitance of the at least one capacitor to be detected, so that the voltage signal is associated with a capacitance change of the at least one capacitor to be detected.

In the embodiments of the present disclosure, initial capacitance (including parasitic capacitance) of a capacitor to be detected is canceled via the cancellation circuit 130, for example, the initial capacitance of the capacitor to be detected is canceled via an adjustable capacitor, so that an output is zero when capacitance of the capacitor to be detected is not changed, thus making an output signal of the conversion circuit 120 associated with a capacitance change of the capacitor to be detected.

An initial value is set as zero by adopting a cancellation circuit, which thus could improve a dynamic range of capacitance detection.

Optionally, in an embodiment of the present disclosure, the at least one capacitor to be detected includes a first capacitor to be detected; and a differential mode signal of voltage signals at different times which are output by the conversion circuit 120 represents a capacitance change of the first capacitor to be detected.

Specifically, when a number of capacitors to be detected is one, a differential mode signal of voltage signals at different times which are output via the conversion circuit 120 reflects a capacitance change of this one capacitor to be detected.

Figure 2:
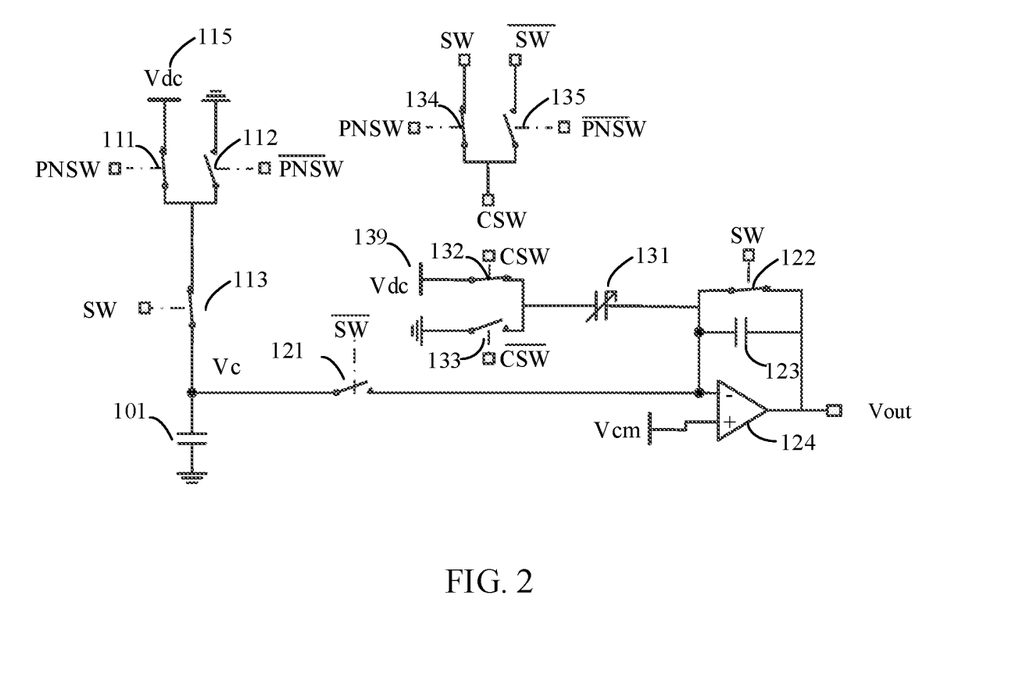
FIG. 2 is a schematic diagram of an apparatus for detecting capacitance of another embodiment of the present disclosure.

FIG. 2 shows a schematic diagram of a specific implementation manner of an apparatus for detecting capacitance of an embodiment of the present disclosure.

It should be understood that FIG. 2 is merely an example, and is not intended to limit the scope of the embodiments of the present disclosure.

As shown in FIG. 2, the signal driving circuit 110 in FIG. 1 may include a first switch 111, a second switch 112, a third switch 113 and a first direct current voltage source 115.

One end of the first capacitor 101 to be detected is connected to the first direct current voltage source 115 via the third switch 113 and the first switch 111, the one end is grounded via the third switch 113 and the second switch 112, and the other end of the first capacitor 101 to be detected is grounded.

The first switch 111 is controlled through a first switch control signal (denoted as PNSW), the second switch 112 is controlled through an inverted signal $\overline{PNSW}$ of PNSW, and the third switch 113 is controlled through a second switch control signal (denoted as SW).

When the first switch 111 and the third switch 113 are switched on, and the second switch 112 is switched off, the first capacitor 101 to be detected is charged by the first direct current voltage source 115. An output voltage of the first direct current voltage source 115 may be denoted as Vdc.

When the second switch 112 and the third switch 113 are switched on, and the first switch 111 is switched off, the first capacitor 101 to be detected is discharged.

As shown in FIG. 2, the conversion circuit 120 in FIG. 1 may include a fourth switch 121, a fifth switch 122, a first feedback capacitor 123 and a first operational amplifier 124.

The fourth switch 121 is controlled through an inverted signal $\overline{SW}$ of SW, and the fifth switch 122 is controlled through SW.

The fourth switch 121 is connected between one end of the first capacitor 101 to be detected and an inverting input of the first operational amplifier 124;

the first feedback capacitor 123 is connected between the inverting input and an output of the first operational amplifier 124;

the fifth switch 122 is connected between the inverting input and the output of the first operational amplifier 124; and a common mode voltage Vcm is input to a non-inverting input of the first operational amplifier 124.

Optionally, a direct current voltage Vdc may be twice the magnitude of the common mode voltage Vcm, i.e., Vcm=0.5*Vdc.

As shown in FIG. 2, the cancellation circuit 130 in FIG. 1 may include a first adjustable capacitor 131, a sixth switch 132, a seventh switch 133, an eighth switch 134, a ninth switch 135 and a second direct current voltage source 139.

Output voltages of the second direct current voltage source 139 and the first direct current voltage source 115 are equal, i.e., both of them are Vdc.

The eighth switch 134 is controlled through PNSW, the ninth switch 135 is controlled through the inverted signal $\overline{PNSW}$ of PNSW, the sixth switch 132 is controlled through a third switch control signal CSW, and the seventh switch 133 is controlled through an inverted signal $\overline{CSW}$ of CSW.

One end of the first adjustable capacitor 131 is connected to the second direct current voltage source 139 via the sixth switch 132, the one end is grounded via the seventh switch 133, and the other end of the first adjustable capacitor 131 is connected to the inverting input of the first operational amplifier 124; and the eighth switch 134 and the ninth switch 135 are configured to change switch control signals controlling the sixth switch 132 and the seventh switch 133.

Specifically, as shown in FIG. 2, CSW and $\overline{CSW}$ are switch control signals of the sixth switch 132 and the seventh switch 133, respectively. When the eighth switch 134 is switched on and the ninth switch 135 is switched off, CSW is equal to SW; and when the eighth switch 34 is switched off and the ninth switch 135 is switched on, CSW is equal to $\overline{SW}$. The sixth switch 132 and the seventh switch 133 are then controlled by CSW and $\overline{CSW}$, respectively.

Figure 3:
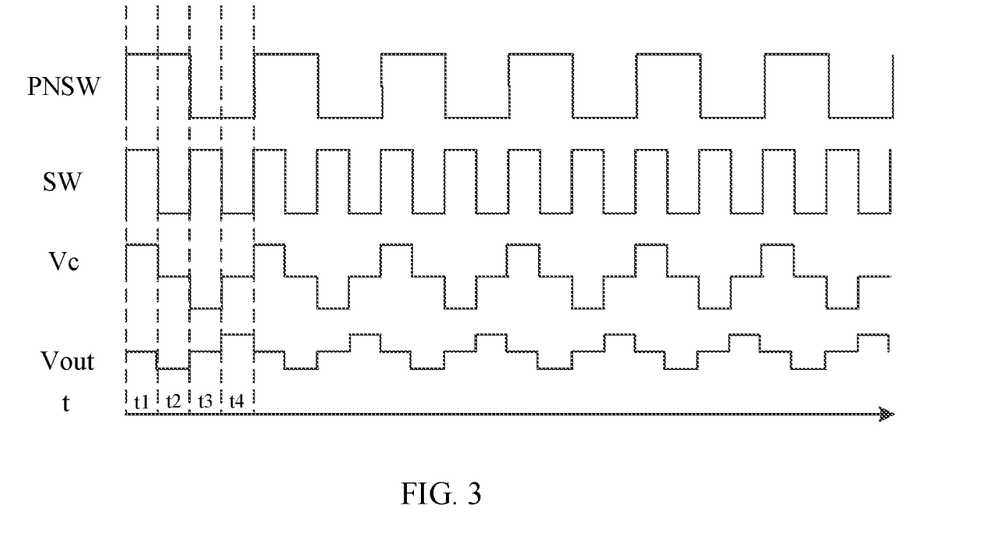
FIG. 3 is an operation time sequence diagram of an apparatus for detecting capacitance of an embodiment of the present disclosure.

Optionally, the first switch control signal PNSW and the second switch control signal SW in FIG. 2 may use signals as shown in FIG. 3

A working principle of a circuit shown in FIG. 2 is described below in combination with FIG. 3.

A complete capacitance detection cycle consists of t1, t2, t3 and t4. A detecting time sequence is a time sequence of driving a signal positively and negatively.

t1: the first switch 111, the third switch 113, the eighth switch 134, the sixth switch 132 and the fifth switch 122 are switched on and the second switch 112, the fourth switch 121, the ninth switch 135 and the seventh switch 133 are switched off, and at this moment, the direct current voltage Vdc charges the first capacitor 101 to be detected forward.

t2: the second switch 112, the third switch 113, the ninth switch 135, the sixth switch 132 and the fifth switch 122 are switched off and the first switch 111, the fourth switch 121, the eighth switch 134 and the seventh switch 133 are switched on, and at this moment, charges on the first capacitor 101 to be detected are transferred onto the first feedback capacitor 123 and the first adjustable capacitor 131. At this time, an output of Vout is:

$$Vout_2 = Vcm - Vcm\frac{C1 - 2Cc}{Cfb}$$

where C1 represents capacitance of the first capacitor 101 to be detected, Cfb represents capacitance of the first adjustable capacitor 131, and Cc represents capacitance of the first feedback capacitor 123.

t3: the second switch 112, the third switch 113, the ninth switch 135, the seventh switch 133 and the fifth switch 122 are switched on and the first switch 111, the fourth switch 121, the eighth switch 134 and the sixth switch 132 are switched off, and at this moment, the first capacitor 101 to be detected is shorted to ground, and the first adjustable capacitor 131 is charged reversely.

t4: the first switch 111, the third switch 113, the eighth switch 134, the seventh switch 133 and the fifth switch 122 are switched off and the second switch 112, the fourth switch 121, the ninth switch 135 and the sixth switch 132 are switched on, and at this moment, charges on the first feedback capacitor 123 and the first adjustable capacitor 131 are transferred onto the first capacitor 101 to be detected. At this time, an output of Vout is:

$$Vout_4 = Vcm + Vcm\frac{C1 - 2Cc}{Cfb}$$

A subsequent stage sampling circuit may obtain a magnitude of a differential mode signal by sampling and subtracting outputs of Vout at t2 and t4:

$$Vout_{DM} = 2*Vcm\frac{C1 - 2Cc}{Cfb} = Vdc*\frac{C1 - 2Cc}{Cfb}$$

In an initial state, a magnitude of capacitance of the first adjustable capacitor 131 may be adjusted so that $C_c=0.5 C1_0$. In this way, initial capacitance $C1_0$ is completely canceled, thus the magnitude of the differential mode signal output is:

$$Vout_{DM} = Vdc*\frac{\Delta C}{Cfb}$$

where ΔC represents a change of capacitance of the first capacitor 101 to be detected.

It can be seen from the above analyses that, by adopting an operation time sequence of driving a signal positively and negatively, the apparatus for detecting capacitance of the embodiments of the present disclosure has an excellent ability of suppressing low-band common noise and 1/f noise (also called flicker noise). That is to say, the apparatus for detecting capacitance of the embodiments of the present disclosure may improve the anti-interference performance, and in this way, capacitance to be detected may also be detected when it is changed slightly. Therefore, the apparatus for detecting capacitance of the embodiments of the present disclosure may detect a slight capacitance change, and may improve the accuracy of capacitance detection.

In addition, the above cancellation circuit of the embodiments of the present disclosure may cancel the initial capacitance completely, and has higher cancellation efficiency.

Optionally, in another embodiment of the present disclosure, the at least one capacitor to be detected includes a first capacitor to be detected and a second capacitor to be detected; and a differential signal of voltage signals which are output by the conversion circuit 120 and are corresponding to the first capacitor to be detected and the second capacitor to be detected represents a capacitance change of the first capacitor to be detected and the second capacitor to be detected.

Specifically, when a number of capacitors to be detected is two, a differential signal of voltage signals which are output via the conversion circuit 120 and are corresponding to two capacitors to be detected reflects a capacitance change of the two capacitors to be detected.

Optionally, for capacitance of the first capacitor to be detected and the second capacitor to be detected, capacitance of one of the capacitors to be detected may be changed and capacitance of the other one of the capacitors to be detected may not be changed, and the capacitance that is not changed may be standard capacitance; and the first capacitor to be detected and the second capacitor to be detected may also constitute a differential capacitive sensor, that is, they may be two capacitors in the differential capacitive sensor. For example, the differential capacitive sensor may be a differential capacitive force sensor.

Figure 4A:
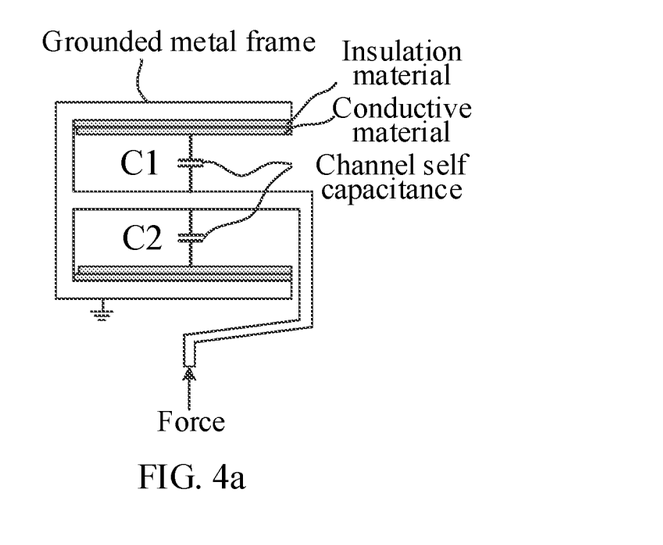
FIGS. 4a-4c are schematic diagrams of differential capacitive force sensors of an embodiment of the present disclosure.
Figure 4B:
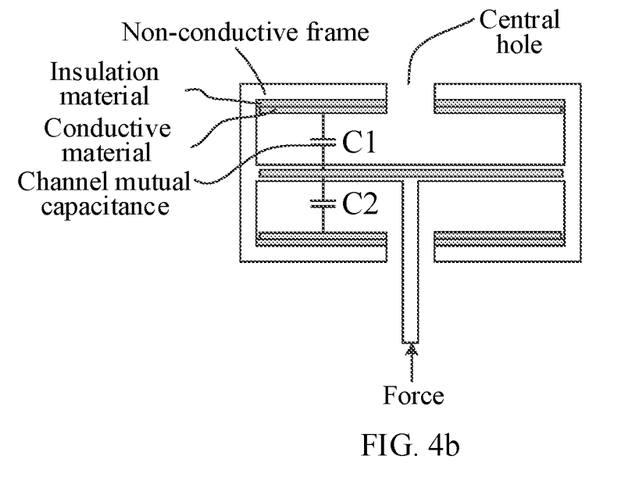
Figure 4C:
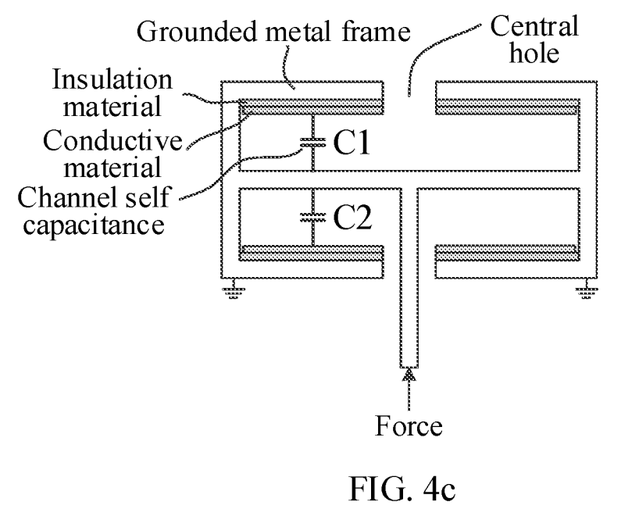

Taking the differential capacitive force sensor as an example, FIGS. 4a-4c respectively show schematic diagrams of three types of differential capacitive force sensor. As shown in FIGS. 4a-4c, a force applied to the differential capacitive force sensor will cause deformation or displacement in an intermediate electrode plate, and then cause capacitance C1 to increase and C2 to decrease, thus forming a differential ΔC. ΔC is the sum of changes of C1 and C2.

Figure 5:
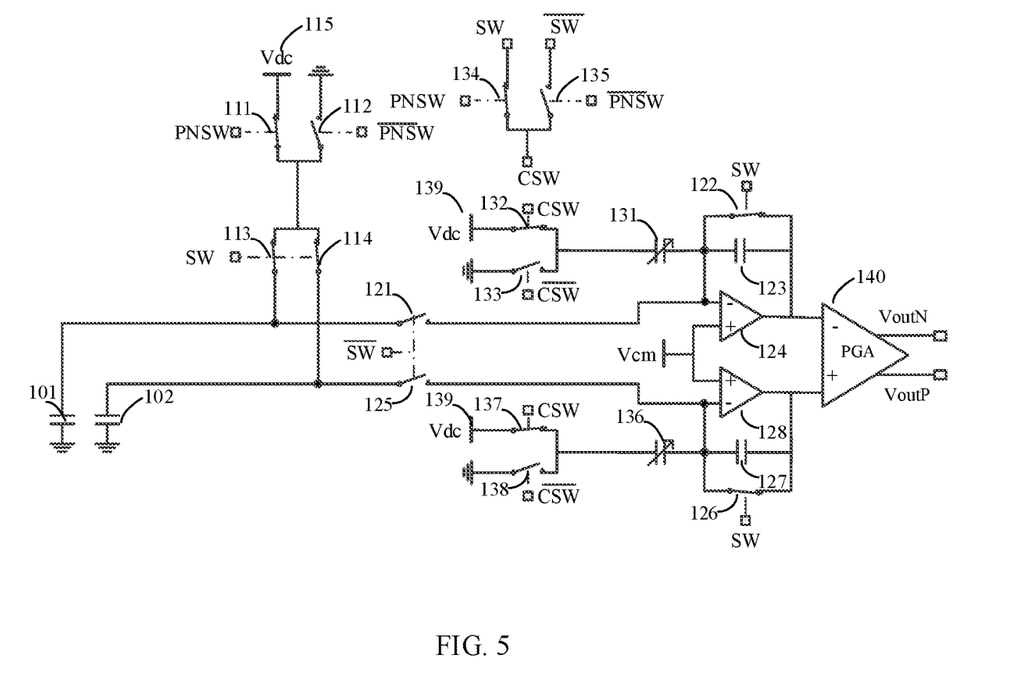
FIG. 5 is a schematic diagram of an apparatus for detecting capacitance of yet another embodiment of the present disclosure.

FIG. 5 shows a schematic diagram of another specific implementation manner of an apparatus for detecting capacitance of an embodiment of the present disclosure.

It should be understood that FIG. 5 is merely an example, and is not intended to limit the scope of the embodiments of the present disclosure.

As shown in FIG. 5, the signal driving circuit 110 in FIG. 1 may include a first switch 111, a second switch 112, a third switch 113, a tenth switch 114 and a first direct current voltage source 115.

The first switch 111 is controlled through a first switch control signal PNSW, the second switch 112 is controlled through an inverted signal $\overline{PNSW}$ of PNSW, and the third switch 113 and the tenth switch 114 are controlled through a second switch control signal SW.

One end of the first capacitor 101 to be detected is connected to the first direct current voltage source 115 via the third switch 113 and the first switch 111, the one end is grounded via the third switch 113 and the second switch 112, and the other end of the first capacitor 101 to be detected is grounded.

One end of the second capacitor 102 to be detected is connected to the first direct current voltage source 115 via the tenth switch 114 and the first switch 111, the one end is grounded via the tenth switch 114 and the second switch 112, and the other end of the second capacitor 102 to be detected is grounded.

When the first switch 111, the third switch 113 and the tenth switch 114 are switched on, and the second switch 112 is switched off, the first capacitor 101 to be detected and the second capacitor 102 to be detected are charged by the first direct current voltage source 115; and When the second switch 112, the third switch 113 and the tenth switch 114 are switched on, and the first switch 111 is switched off, the first capacitor 101 to be detected and the second capacitor 102 to be detected are discharged.

As shown in FIG. 5, the conversion circuit 120 in FIG. 1 may include a fourth switch 121, a fifth switch 122, a first feedback capacitor 123, a first operational amplifier 124, an eleventh switch 125, a twelfth switch 126, a second feedback capacitor 127 and a second operational amplifier 128.

The fourth switch 121 and the eleventh switch 125 are controlled through an inverted signal $\overline{SW}$ of the SW, and the fifth switch 122 and the twelfth switch 126 are controlled through SW.

The fourth switch 121 is connected between one end of the first capacitor 101 to be detected and an inverting input of the first operational amplifier 124;

the first feedback capacitor 123 is connected between the inverting input and an output of the first operational amplifier 124;

the fifth switch 122 is connected between the inverting input and the output of the first operational amplifier 124;

the eleventh switch 125 is connected between one end of the second capacitor 102 to be detected and an inverting input of the second operational amplifier 128;

the second feedback capacitor 127 is connected between the inverting input and an output of the second operational amplifier 128;

the twelfth switch 126 is connected between the inverting input and the output of the second operational amplifier 128; and a common mode voltage Vcm is input to both non-inverting inputs of the first operational amplifier 124 and the second operational amplifier 128.

As shown in FIG. 5, the cancellation circuit 130 in FIG. 1 includes a first adjustable capacitor 131, a sixth switch 132, a seventh switch 133, an eighth switch 134, a ninth switch 135, a second adjustable capacitor 136, a thirteenth switch 137, a fourteenth switch 138 and a second direct current voltage source 139.

The eighth switch 134 is controlled through PNSW, the ninth switch 135 is controlled through the inverted signal $\overline{PNSW}$ of PNSW, the sixth switch 132 and the thirteenth switch 137 are controlled through a switch control signal CSW, and the seventh switch 133 and the fourteenth switch 138 are controlled through an inverted signal $\overline{CSW}$ of CSW.

One end of the first adjustable capacitor 131 is connected to the second direct current voltage source 139 via the sixth switch 132, the one end is grounded via the seventh switch 133, and the other end of the first adjustable capacitor 131 is connected to the inverting input of the first operational amplifier 124;

one end of the second adjustable capacitor 136 is connected to the second direct current voltage source 139 via the thirteenth switch 137, the one end is grounded via the fourteenth switch 138, and the other end of the second adjustable capacitor 136 is connected to the inverting input of the second operational amplifier 128; and the eighth switch 134 and the ninth switch 135 are configured to change switch control signals controlling the sixth switch 132, the seventh switch 133, the thirteenth switch 137 and the fourteenth switch 138.

Optionally, the first switch control signal PNSW and the second switch control signal SW in FIG. 5 may use signals as shown in FIG. 3. An operation time sequence of a circuit in FIG. 5 may be the same as that in FIG. 2.

It should be understood that a working principle of each of two circuits in FIG. 5 which are respectively corresponding to the first capacitor 101 to be detected and the second capacitor 102 to be detected is similar to the working principle of the circuit in FIG. 2.

Optionally, the apparatus shown in FIG. 5 may be applied to a force sensor. In this case, the first capacitor 101 to be detected and the second capacitor 102 to be detected may be two capacitors in the force sensor, for example, they may be C1 and C2 in FIGS. 4*a*-4*c*. With the apparatus shown in FIG. 5, capacitance changes of the first capacitor 101 to be detected and the second capacitor 102 to be detected may be detected, thus obtaining a change of a force.

In an initial state, capacitance of the first adjustable capacitor 131 and the second adjustable capacitor 136 may be adjusted so that a differential output voltage is zero. When the capacitance of the first capacitor 101 to be detected and the second capacitor 102 to be detected are changed, for example, when a force is applied, an output differential voltage is:

$$Vout_{DM} = Vdc * \frac{\Delta C}{Cfb}$$

where ΔC represents the sum of changes of the first capacitor 101 to be detected and the second capacitor 102 to be detected. That is to say, the output differential voltage may represent capacitance changes of two capacitors to be detected.

Optionally, as shown in FIG. 5, the apparatus may further include:

a programmable gain amplifier 140, configured to output a differential signal according to voltage signals corresponding to the first capacitor 101 to be detected and the second capacitor 102 to be detected.

By outputting a differential signal using a programmable gain amplifier 140, a common mode voltage of a differential output may be stabilized.

By adopting a differential structure, the apparatus for detecting capacitance of the embodiments of the present disclosure has an excellent ability of suppressing a temperature drift.

Optionally, multiple times of integrating may also be performed on a circuit output for average, so as to effectively improve a signal to noise ratio of a system and improve the detection accuracy, in particular, in the case where capacitance of the capacitor to be detected is micro capacitance in a level of fF-pF.

Optionally, an analog integration scheme may be adopted, i.e., adding a stage of integrating circuit or changing a time sequence of a detection circuit so as to increase the number of times of integration of a C/V converting circuit, and then performing analog-to-digital converter (Analog-to-Digital Converter, ADC) sampling. A digital integration scheme may also be adopted, i.e., directly inputting an output of a detection circuit to an ADC for sampling, and then performing integration processing on sampled data via a digital processor.

To sum up, the apparatus for detecting capacitance of the embodiments of the present disclosure could effectively suppress low-band common noise and 1/f noise by adopting an operation time sequence of driving a signal positively and negatively, has an ability of suppressing a temperature drift and an ability of suppressing a zero point shift by adopting a differential structure, and has lower power consumption by adopting a switch capacitor circuit consisting of a switch controlled by a switch control signal and a capacitor, which thus could make the apparatus have a high signal to noise ratio for facilitating the apparatus being integrated into an integrated circuit (IC), and have a higher detection sensitivity, capable of detecting capacitance of a level of fF.

An embodiment of the present disclosure further provides an electronic device, and the electronic device may include the apparatus for detecting capacitance of the above embodiments of the present disclosure.

An embodiment of the present disclosure further provides an apparatus for detecting a force, and the apparatus for detecting a force may include the apparatus for detecting capacitance of the above embodiments of the present disclosure, where a force which is to be detected by the apparatus for detecting a force is associated with a capacitance change of a capacitor to be detected which is to be detected by the apparatus for detecting capacitance.

For example, the apparatus for detecting a force may specifically be a force sensor, where the force sensor may be disposed in a stylus, but the embodiment of the present disclosure is not limited to this.

It should be understood that a specific example herein is just for helping a person skilled in the art to better understand the embodiments of the present disclosure, rather than for limiting the scope of the embodiments of the present disclosure.

A person of ordinary skill in the art may realize that, units and algorithm steps of various examples described in connection with the embodiments disclosed herein can be implemented by electronic hardware, computer software, or a combination of both, and in order to clearly describe the interchangeability of hardware and software, in the above description, the composition and steps of the various embodiments have been generally described according to functions. Whether these functions are executed in a manner of hardware or software depends on the specific applications and design constraints of the technical solution. A person skilled may implement the described functions by using different methods for each specific application, but this implementation should not be considered to be beyond the scope of the present disclosure.

In several embodiments provided in the present application, it should be understood that, the disclosed system, apparatus and method may be implemented in other manners. For example, the apparatus embodiments described above are merely exemplary, e.g., the division of the units is merely a logic function division, and other division manners may exist in practical implementation, for example, a plurality of units or components may be combined or integrated to another system, or some features may be omitted or be not executed. In addition, the displayed or discussed mutual coupling or direct coupling or a communication connection may be indirect coupling or a communication connection via some interfaces, apparatuses or units, and may also be a connection in electrical, mechanical or other forms.

The units described as separate parts may be or may not be separated physically, and a component displayed as a unit may be or may not be a physical unit, namely, may be located in one place, or may be distributed on a plurality of network units. Some or all of the units may be selected to achieve the purposes of the solutions in the embodiments of the present disclosure according to actual needs.

In addition, in various embodiments of the present disclosure, respective functional units may be integrated in one processing unit, or the respective units may physically exist separately, or two or more units may be integrated in one unit. The above integrated unit may either be implemented in the form of hardware, or be implemented in a form of a software functional unit.

If the integrated unit is implemented in the form of the software functional unit and is sold or used as an independent product, it may be stored in a computer readable storage medium. Based on such an understanding, the technical solutions of the present disclosure substantially, or some of the technical solutions making contribution to the prior art, or all of or some of the technical solutions may be embodied in the form of a software product, and the computer software product is stored in a storage medium, which includes multiple instructions to enable a computer device (which may be a personal computer, a server, a network device or the like) to execute all of or some of the steps of the methods in the respective embodiments of the present disclosure. In addition, the foregoing storage medium includes a variety of media capable of storing program codes, for example, a USB disk, a mobile hard disk, a read-only memory (Read-Only Memory, ROM), a random access memory (Random Access Memory, RAM), a magnetic disk, an optical disk or the like.

Described above is the specific embodiments of the present disclosure only, but the protection scope of the present disclosure is not limited to this, any person who is skilled and familiar with the present technical field could readily think of various equivalent modifications or substitutions within the technical scope disclosed by the present disclosure, and all of these modifications or substitutions shall fall within the protection scope of the present disclosure. Therefore, the protection scope of the present disclosure shall be subject to the protection scope defined by the claims.

The invention claimed is:

1. An apparatus for detecting capacitance, comprising:
a signal driving circuit (110), configured to periodically charge and discharge at least one capacitor to be detected;
a conversion circuit (120), configured to convert a capacitance signal of the at least one capacitor to be detected into a voltage signal; and
a cancellation circuit (130), configured to cancel initial capacitance of the at least one capacitor to be detected, so that the voltage signal is associated with a capacitance change of the at least one capacitor to be detected;
wherein the at least one capacitor to be detected comprises a first capacitor (101) to be detected; and
a differential mode signal of voltage signals at different times which are output by the conversion circuit (120) represents a capacitance change of the first capacitor (101) to be detected;
wherein the conversion circuit (120) comprises a fourth switch (121), a fifth switch (122), a first feedback capacitor (123) and a first operational amplifier (124);
the fourth switch (121) is connected between one end of the first capacitor (101) to be detected and an inverting input of the first operational amplifier (124);
the first feedback capacitor (123) is connected between the inverting input and an output of the first operational amplifier (124);
the fifth switch (122) is connected between the inverting input and the output of the first operational amplifier (124); and
a common mode voltage Vcm is input to a non-inverting input of the first operational amplifier (124);
wherein the cancellation circuit (130) comprises a first adjustable capacitor (131), a sixth switch (132), a seventh switch (133), an eighth switch (134), a ninth switch (135) and a second direct current voltage source (139);

one end of the first adjustable capacitor (131) is connected to the second direct current voltage source (139) via the sixth switch (132), the one end of the first adjustable capacitor (131) is grounded via the seventh switch (133), and the other end of the first adjustable capacitor (131) is connected to the inverting input of the first operational amplifier (124); and the eighth switch (134) and the ninth switch (135) are configured to change switch control signals controlling the sixth switch (132) and the seventh switch (133).

2. The apparatus according to claim 1, wherein an output voltage of the first direct current voltage source (115) is equal to that of the second direct current voltage source (139).

3. The apparatus according to claim 2, wherein the output voltage is twice the magnitude of the common mode voltage Vcm.

4. An electronic device, comprising the apparatus for detecting capacitance according to claim 1.

5. An apparatus for detecting a force, comprising the apparatus for detecting capacitance according to claim 1.

6. An apparatus for detecting capacitance, comprising:
a signal driving circuit (110), configured to periodically charge and discharge at least one capacitor to be detected;
a conversion circuit (120), configured to convert a capacitance signal of the at least one capacitor to be detected into a voltage signal; and
a cancellation circuit (130), configured to cancel initial capacitance of the at least one capacitor to be detected, so that the voltage signal is associated with a capacitance change of the at least one capacitor to be detected;
wherein the at least one capacitor to be detected comprises a first capacitor (101) to be detected; and
a differential mode signal of voltage signals at different times which are output by the conversion circuit (120) represents a capacitance change of the first capacitor (101) to be detected;
wherein the signal driving circuit (110) comprises a first switch (111), a second switch (112), a third switch (113) and a first direct current voltage source (115); and
one end of the first capacitor (101) to be detected is connected to the first direct current voltage source (115) via the third switch (113) and the first switch (111), the one end of the first capacitor (101) to be detected is grounded via the third switch (113) and the second switch (112), and the other end of the first capacitor (101) to be detected is grounded.

7. The apparatus according to claim 6, wherein the conversion circuit (120) comprises a fourth switch (121), a fifth switch (122), a first feedback capacitor (123) and a first operational amplifier (124);
the fourth switch (121) is connected between one end of the first capacitor (101) to be detected and an inverting input of the first operational amplifier (124);
the first feedback capacitor (123) is connected between the inverting input and an output of the first operational amplifier (124);
the fifth switch (122) is connected between the inverting input and the output of the first operational amplifier (124); and
a common mode voltage Vcm is input to a non-inverting input of the first operational amplifier (124).

8. The apparatus according to claim 7, wherein the cancellation circuit (130) comprises a first adjustable capacitor (131), a sixth switch (132), a seventh switch (133), an eighth switch (134), a ninth switch (135) and a second direct current voltage source (139);
one end of the first adjustable capacitor (131) is connected to the second direct current voltage source (139) via the sixth switch (132), the one end of the first adjustable capacitor (131) is grounded via the seventh switch (133), and the other end of the first adjustable capacitor (131) is connected to the inverting input of the first operational amplifier (124); and
the eighth switch (134) and the ninth switch (135) are configured to change switch control signals controlling the sixth switch (132) and the seventh switch (133).

9. An apparatus for detecting capacitance, comprising:
a signal driving circuit (110), configured to periodically charge and discharge at least one capacitor to be detected;
a conversion circuit (120), configured to convert a capacitance signal of the at least one capacitor to be detected into a voltage signal; and
a cancellation circuit (130), configured to cancel initial capacitance of the at least one capacitor to be detected, so that the voltage signal is associated with a capacitance change of the at least one capacitor to be detected;
wherein the at least one capacitor to be detected comprises a first capacitor (101) to be detected and a second capacitor (102) to be detected; and
a differential signal of voltage signals which are output by the conversion circuit (120) and are corresponding to the first capacitor (101) to be detected and the second capacitor (102) to be detected represents a capacitance change of the first capacitor (101) to be detected and the second capacitor (102) to be detected;
wherein the signal driving circuit (110) comprises a first switch (111), a second switch (112), a third switch (113), a tenth switch (114) and a first direct current voltage source (115);
one end of the first capacitor (101) to be detected is connected to the first direct current voltage source (115) via the third switch (113) and the first switch (111), the one end of the first capacitor (101) to be detected is grounded via the third switch (113) and the second switch (112), and the other end of the first capacitor (101) to be detected is grounded; and
one end of the second capacitor (102) to be detected is connected to the first direct current voltage source (115) via the tenth switch (114) and the first switch (111), the one end of the second capacitor (102) to be detected is grounded via the tenth switch (114) and the second switch (112), and the other end of the second capacitor (102) to be detected is grounded.

10. The apparatus according to claim 9, wherein the conversion circuit (120) comprises a fourth switch (121), a fifth switch (122), a first feedback capacitor (123), a first operational amplifier (124), an eleventh switch (125), a twelfth switch (126), a second feedback capacitor (127) and a second operational amplifier (128);
the fourth switch (121) is connected between one end of the first capacitor (101) to be detected and an inverting input of the first operational amplifier (124);
the first feedback capacitor (123) is connected between the inverting input and an output of the first operational amplifier (124);
the fifth switch (122) is connected between the inverting input and the output of the first operational amplifier (124);

the eleventh switch (125) is connected between one end of the second capacitor (102) to be detected and an inverting input of the second operational amplifier (128);

the second feedback capacitor (127) is connected between the inverting input and an output of the second operational amplifier (128);

the twelfth switch (126) is connected between the inverting input and the output of the second operational amplifier (128); and a common mode voltage Vcm is input to both non-inverting inputs of the first operational amplifier (124) and the second operational amplifier (128).

11. The apparatus according to claim 10, wherein the cancellation circuit (130) comprises a first adjustable capacitor (131), a sixth switch (132), a seventh switch (133), an eighth switch (134), a ninth switch (135), a second adjustable capacitor (136), a thirteenth switch (137), a fourteenth switch (138) and a second direct current voltage source (139);

one end of the first adjustable capacitor (131) is connected to the second direct current voltage source (139) via the sixth switch (132), the one end of the first adjustable capacitor (131) is grounded via the seventh switch (133), and the other end of the first adjustable capacitor (131) is connected to the inverting input of the first operational amplifier (124);

one end of the second adjustable capacitor (136) is connected to the second direct current voltage source (139) via the thirteenth switch (137), the one end of the second adjustable capacitor (136) is grounded via the fourteenth switch (138), and the other end of the second adjustable capacitor (136) is connected to the inverting input of the second operational amplifier (128); and the eighth switch (134) and the ninth switch (135) are configured to change switch control signals controlling the sixth switch (132), the seventh switch (133), the thirteenth switch (137) and the fourteenth switch (138).

12. The apparatus according to claim 11, wherein the apparatus further comprises:

a programmable gain amplifier (140), configured to output a differential signal according to voltage signals corresponding to the first capacitor (101) to be detected and the second capacitor (102) to be detected.

13. The apparatus according to claim 11, wherein an output voltage of the first direct current voltage source (115) is equal to that of the second direct current voltage source (139).

14. The apparatus according to claim 13, wherein the output voltage is twice the magnitude of the common mode voltage Vcm.

* * * * *